(12) United States Patent
Sodagam et al.

(10) Patent No.: US 10,755,010 B2
(45) Date of Patent: Aug. 25, 2020

(54) METASTABILITY INSERTION USING THE X-STATE

(71) Applicants: Advanced Micro Devices, Inc., Santa Clara, CA (US); ATI Technologies ULC, Markham (CA)

(72) Inventors: Shalini Sodagam, San Jose, CA (US); Anandh Ganesan, San Jose, CA (US); Nandeesh Thimmappa, Milpitas, CA (US); Damon Tohidi, Ontario (CA)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/139,335

(22) Filed: Sep. 24, 2018

(65) Prior Publication Data

US 2020/0097626 A1 Mar. 26, 2020

(51) Int. Cl.
*G06F 30/3312* (2020.01)
*G06F 30/30* (2020.01)

(52) U.S. Cl.
CPC .......... *G06F 30/3312* (2020.01); *G06F 30/30* (2020.01)

(58) Field of Classification Search
CPC ............... G06F 17/504; G06F 17/5009; G06F 17/5022; G06F 17/5031; G06F 2217/84; G06F 30/33; G06F 30/30; G06F 30/323; G06F 30/327; G06F 30/3312; G06F 30/3315

USPC .......................................................... 716/108
See application file for complete search history.

(56) References Cited

U.S. PATENT DOCUMENTS

2005/0251779 A1* 11/2005 Chard ..................... G06F 30/33
   716/108
2015/0161315 A1* 6/2015 Meil ................... G06F 17/5031
   716/108

OTHER PUBLICATIONS

Dally, W. and Poulton, J., "Digital Systems Engineering," The Press Syndicate of the University of Cambridge, 1998, pp. 462-513.
(Continued)

*Primary Examiner* — Paul Dinh
(74) *Attorney, Agent, or Firm* — Zagorin Cave LLP (57) ABSTRACT

An indeterminate state representative of a metastable state is inserted into an output signal of a circuit representation responsive to the circuit representation receiving a metastable triggering event during a register transfer language (RTL) simulation. The simulation view of the RTL has been modified to ensure that the indeterminate state is propagated through the circuit representations regardless of the input on which the indeterminate state appears. The indeterminate state is maintained for a programmable amount of time and responsive to expiration of the amount of time, the output signal is set to a random binary value.

17 Claims, 5 Drawing Sheets

(56) References Cited

OTHER PUBLICATIONS

Ginosar, R., "Metastability and Synthronizers: A Tutorial," IEEE CS and the IEEE CASS, Sep./Oct. 2011, pp. 23-35.
Vimjam, V. and Joseph, A., "Challenges in Verification of Clock Domain Crossings," DAC.com Knowledge Center Article, 2012, 9 pages.
Hsiung, J., et al., "Preventing Chip-Killing Glitches on CDC Paths with Automated Formal Analysis," Feb. 20, 2018, downloaded Feb. 28, 2019 from Mediatek.com, 1 page.
Hari, A., et al., "Verification of Clock Domain Crossing Jitter and Metastability Tolerance using Emulation," DVCon 2012, 7 pages.
Doxygen, "vrq Documentation," Revision 1.0.81, downloaded from http://vrq.sourceforge.net/html/plugin_list.html, admitted prior to Sep. 24, 2018, 23 pages.

\* cited by examiner

```
always @ (posedge clk)
begin
if (reset)
   q<=1'b0;
else
   q<=d;
end
```

Fig. 4

```
always @ (clk) begin
    if (clk)
       begin
             if (reset) begin
                 q <= 1'b0;
             end else begin
                if (~reset) begin
                    q<=d;
                end
                else begin
                    q<=x;
                end
             end
       end
       else if (~clk) begin
       end else begin
            q<=x;
       end
end
```

METASTABILITY INSERTION USING THE X-STATE

BACKGROUND

Description of the Related Art

Metastable events can cause unpredictable results in digital designs. The metastable state may be entered, e.g., when a data transition occurs that violates the setup or hold time for a circuit such as a flip-flop. When a circuit enters a metastable state, its output is unstable and may oscillate between a voltage level corresponding to a logical 0 and a logical 1 or remain at a voltage level between a logical 0 and a logical 1. The circuit typically settles to either the 0 state or the 1 state but not necessarily the correct state. Standard delay format (SDF) back annotated gate simulations with timing checks can be used to evaluate metastability, but such simulations rely on delays from the physical design, e.g., the RC component of signal lines after place and route and gate delay information. Such simulation is computationally intensive and slow and can be run only during the end phases of a design cycle.

SUMMARY OF EMBODIMENTS OF THE INVENTION

Improvements in simulating metastable events are desirable. Accordingly, in an embodiment, a method of simulating a design includes setting an output signal of a circuit representation to an indeterminate state responsive to the circuit representation receiving a metastable triggering event during a register transfer language (RTL) simulation. The indeterminate state is maintained for an amount of time and responsive to expiration of the amount of time, the output signal is set to a random binary value.

In another embodiment, a method of simulating a hardware design includes setting a first signal to a representation of a metastable state during a register transfer language (RTL) simulation of the hardware design. The representation of the metastable state for the first signal is maintained for a specified amount of time and responsive to expiration of the specified amount of time the first signal is set to a random value.

In another embodiment, a non-transitory computer-readable storage medium stores instructions executable on one or more processors to cause the one or more processors to set an output signal of a circuit representation to an indeterminate state in responsive to the circuit representation receiving a metastable triggering event. The instructions cause the one or more processors to maintain the indeterminate state on the output signal for a specified amount of time and after expiration of the specified amount of time, set the output signal to a random binary value.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Accurately assessing at an early design stage the potential impact of meta-stable events can help reduce design costs. In order to provide more accurate assessment of metastable events during simulation of a register transfer language (RTL) description of a design, embodiments insert non deterministic behavior in the form of an X-state into the outputs of circuits affected by metastable trigger events. Metastability Insertion through the X-state (MIX) helps designers determine the impact of metastable events occurring in high speed designs caused by such events as clock glitches, missing synchronizers between different clock domains of the design, or erroneous asynchronous reset distribution. Traditional techniques of addressing metastable events during the register transfer language (RTL) phase of a design have been limited to just identification of the metastable event, after which the designers use theoretical methods to deduce the impact of the metastable event and fix or waive the identified issue.

Figure 1:
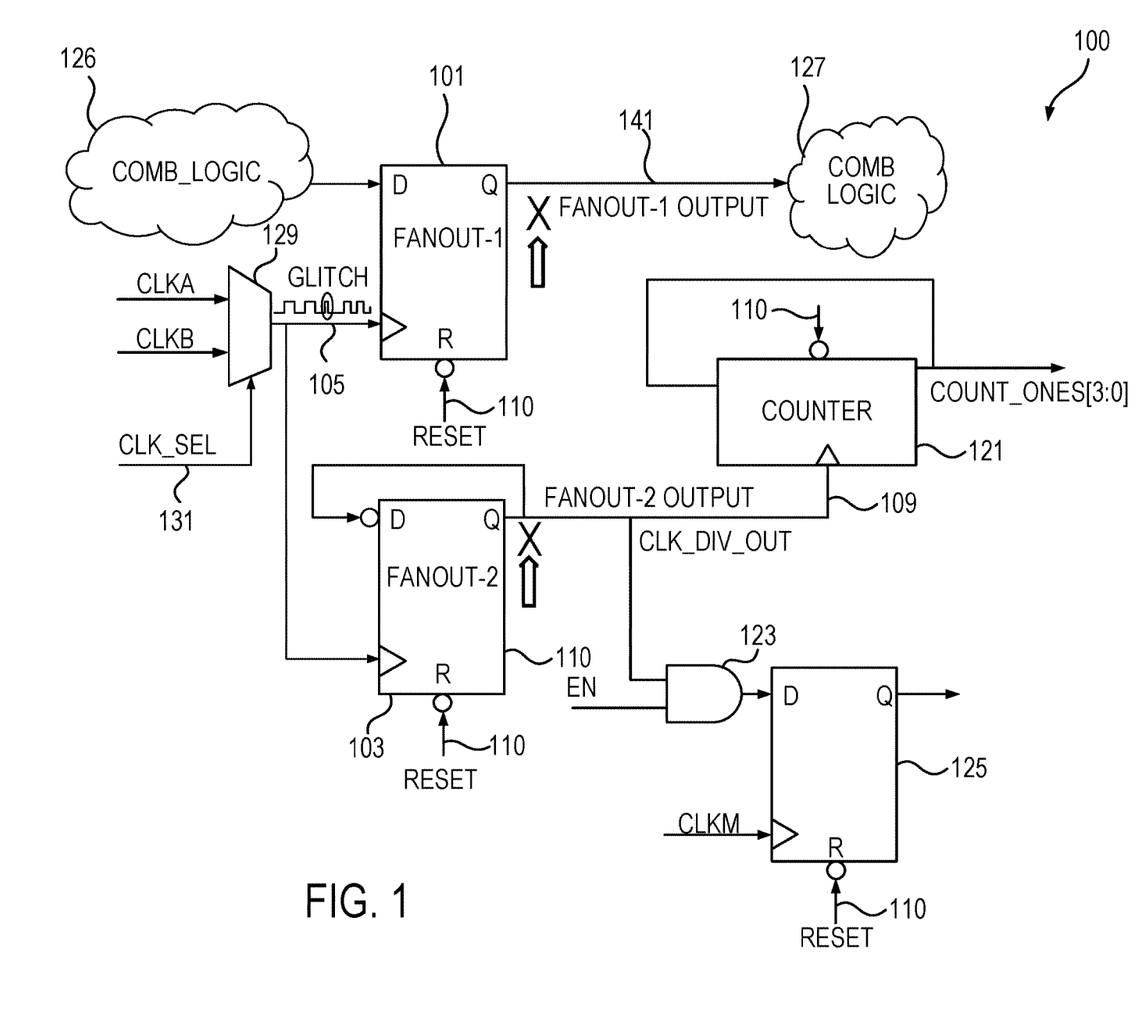
FIG. 1 illustrates a portion of logic of a device being simulated.

FIG. 1 illustrates a small portion of logic 100 of a device being simulated. The portion of logic 100 includes flip-flops 101 and 103 that receive a clock signal 105. The flip-flop 103 divides the clock signal and supplies a divided clock signal 109 (CLK_DIV_OUT) to two loads, counter 121 and AND gate 123. Flip-flop 125 receives the output of AND gate 123. The counter 121 has continuous feedback and supplies a four bit output count_ones[3:0]. Flip-flop 101 receives data from combinatorial logic 126 and supplies its Q output to combinatorial logic 127.

Multiplexer 129 supplies the clock signal 105 selecting between CLKA and CLKB using the clock select signal 131. If the clock select signal switches at the wrong time, a glitch occurs is the clock signal 105 supplied by the multiplexer 129.

Figure 2:
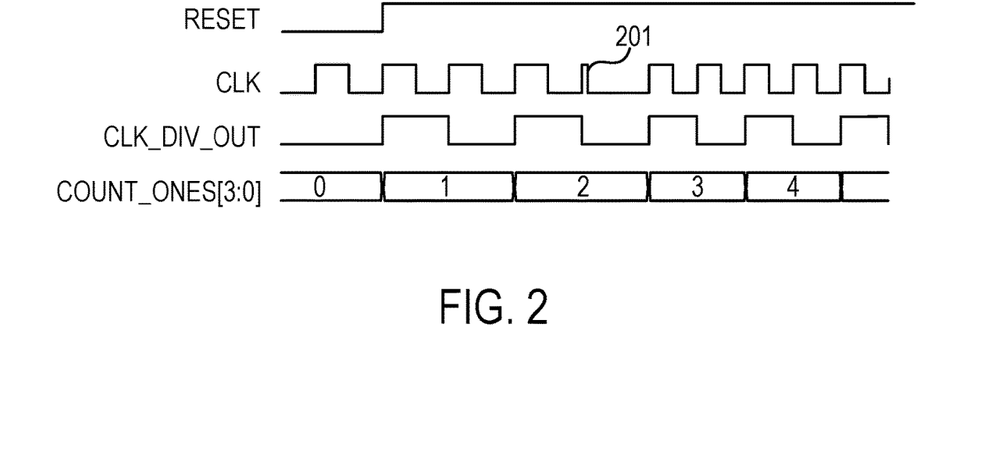
FIG. 2 shows a timing diagram of a subset of the portion of logic illustrating a conventional RTL simulation.

FIG. 2 illustrates a timing diagram of the operation of a subset of the logic 100 in a normal RTL simulation environment. A reset signal 110 (active low) causes the Q output of the flip-flop 103 to be zero during assertion of reset. The flip-flop 103 divides the clock signal 105 in half and supplies the clock signal 109 to the loads described above. The clock signal 105 includes a glitch at 201 in which the clock signal is shorter than normal as a result, e.g., of the clock select signal 131 changing value to select CLKA instead of CLKB (or vice versa). As can be seen in the timing diagram illustrating the results of the simulation, the output of counter output 121 is unaffected by the glitch as the counter counts properly from 1 to 4 despite the glitch. Thus, from the simulation results shown in FIG. 2, the glitch on clock signal 105 appears benign and no action needs to be taken to address a potential problem caused by the select signal 131.

Instead of running a conventional RTL simulation, the MIX technique first identifies the meta-stable trigger event(s), which include, e.g., such metastability sources as a clock glitches, asynchronous resets, and clock domain crossing violations. The MIX technique introduces a non-deterministic behavior in the form of an X-state into the outputs of circuits affected by the metastable triggering event. Such circuits are those circuits that are fanouts of the signal associated with the metastable triggering event and susceptible to become metastable. For example, in FIG. 1 the fanouts of the clock signal 105 with the clock glitch are flip-flops 101 and 103. The X-state lasts for a period of time during simulation and the X-state is settled by randomly assigning the output signals of the fanout circuits from the X-state to a 1 or 0. After simulation completes, the engineer checks to see if the design is able to flush out the inserted metastable state (the X-state) and recover to a known and correct state. With this approach, not only can the designer visualize the impact of the non-deterministic behavior of the circuit but can also come up with effective design fixes. The technique is versatile and can be implemented in a wide range of hardware verification languages such as Verilog, System Verilog, or VHDL and in verification environments such as Universal Verification Methodology (UVM), System C, Perl, etc.

Figure 3:
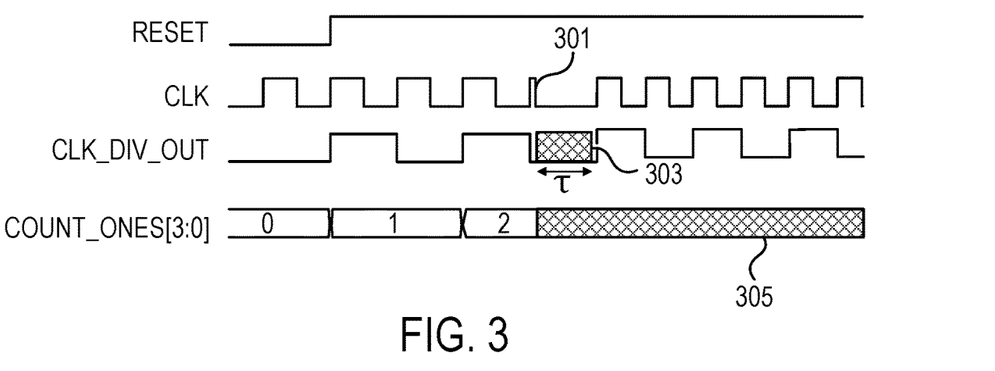
FIG. 3 shows a timing diagram illustrating the use of the Metastability Insertion through the X-state (MIX) technique in simulation.

FIG. 3 shows a timing diagram illustrating the use of the MIX technique in simulation of the logic shown in FIG. 1. The MIX technique inserts non-deterministic behavior into the RTL to better understand the potential impact of the metastable triggering event. FIG. 3 visually shows the impact of the metastable event. The glitch on the clock signal 105 caused by switching from CLKA to CLKB or vice versa, has been identified as a metastable triggering event signal. The clock signal with the glitch can be seen in FIG. 1 to supply two flip-flops 101 and 103, which could become metastable as a result of the clock glitch. The simulation starts off the same as in FIG. 2. However, the RTL is modified to force the fanout outputs 141 (FANOUT-1 OUTPUT) and 109 (FANOUT-2 OUTPUT, which is also the divided clock signal CLK_DIV_OUT) responsive to the glitch at 301 to the non-deterministic X-state illustrated at 303. Note that FIG. 3 only shows the X-state for the output of flip-flop 103 and not the X-state for the output of flip-flop 101 for ease of illustration. The X output on the CLK_DIV_OUT signal in turn causes the output (COUNT_ONES [3:0]) of the counter 121 to enter and remain in an indeterminate state as shown in 305. Thus, the counter 121 was unable to recover due to its continuous feedback logic, which results in the assertions written for the counter to fail, thereby causing the tests to fail. The logic that needs the counter output can also become indeterministic and the tests that need the counter's output can also subsequently fail.

In this case, if there had been a reset event after the clock glitch at 301, the logic would have been reset and the X's would have been flushed out of the device being simulated, bringing the counter 121 back to a known state. Thus, in comparison to FIG. 2, the simulation with the MIX technique clearly shows that the counter 121 fails to resolve to a known and correct state even if the metastability of CLK_DIV_OUT resolves prior to the next rising edge of CLK.

The CLK_DIV_OUT signal 109 along with the Q output 141 are maintained at the X-state for a programmable amount of time. In embodiments, the amount of time ($\tau$) is programmable. The time $\tau$ is typically based on the specified metastability settling time of the particular circuit, for a given technology. For example, in embodiments, the time the X-state is maintained is based, e.g., on fabrication technology, the loads on the fanout circuit outputs, and/or information provided from circuit libraries used in the design. In addition, some circumstances the time $\tau$ includes extra pessimism on top of time based on other sources of the time $\tau$ identified above. Embodiments specify the metastability time $\tau$ in terms of clock cycles, portions thereof, or any time base that is available in the particular simulator being used. Thus, e.g., the metastability event, represented by the insertion of the X-state at 303 in FIG. 3, is specified to last for the duration $\tau$ shown in FIG. 3. At the end of t, the system randomly (pseudo randomly) settles the metastable output signal of the fanout circuit to a 1 or 0. Thus, e.g., referring again to FIG. 1, the FANOUT-1 OUTPUT 141 is randomly assigned to a 1 or 0 and FANOUT-2 OUTPUT 109 is independently randomly assigned to a 1 or 0. Thus, the binary values at which FANOUT-1 OUTPUT and the FANOUT-2 OUTPUT settle after the X-state may be different or the same. In the example of FIG. 3, CLK_DIV_OUT was settled to a zero at the end of T.

In embodiments, separate values may be specified for each fanout circuit that goes metastable during the simulation. That accounts for different types of circuits, different loads on the output signal, or other factors that makes the time period $\tau$ different. Thus, e.g., in embodiments a user interface allows multiple $\tau$ values to be set and associated with different fanout circuits affected by the metastability triggering event. Other embodiments allow only a single $\tau$ value to be specified.

Providing visualization of the x-propagation through the waveforms such as shown in FIG. 3 gives the designer better insight into the metastability problem itself and exhaustive random testing of the design with the MIX technique will prove robustness of any fix made to address the problem.

Figure 4:
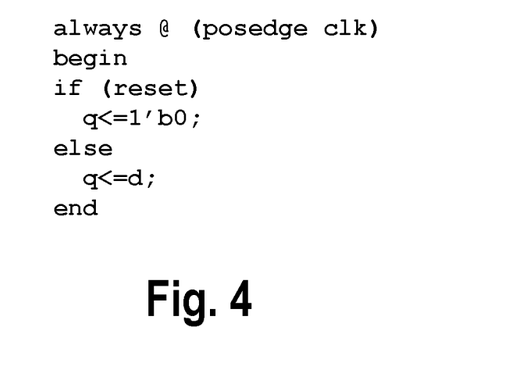
FIG. 4 illustrates conventional RTL code for a flip-flop.

In addition to inserting the indeterminate state (the X-state), the RTL has to be modified so as to not quash the X-state when received on such inputs as clock or reset. In an embodiment, this process of modifying the RTL is referred to as X-uglification but any technique that ensures that the X-state is not quashed by the logic representation in the RTL is appropriate. X-uglification is illustrated with reference to FIGS. 4 and 5. FIG. 4 illustrates a conventional RTL model for a flip-flop with an active-high reset. In FIG. 4, if reset is asserted, the flip-flop output q is zero. If reset is unasserted, at the positive edge of the clock, the q output is assigned the value of the d input. Without X-uglification, the q output takes on the x value only if d is x, and xs present on clk or reset are quashed. That is, an x at clk or reset is not propagated through the flip-flop of FIG. 4 to its q output.

Figure 5:
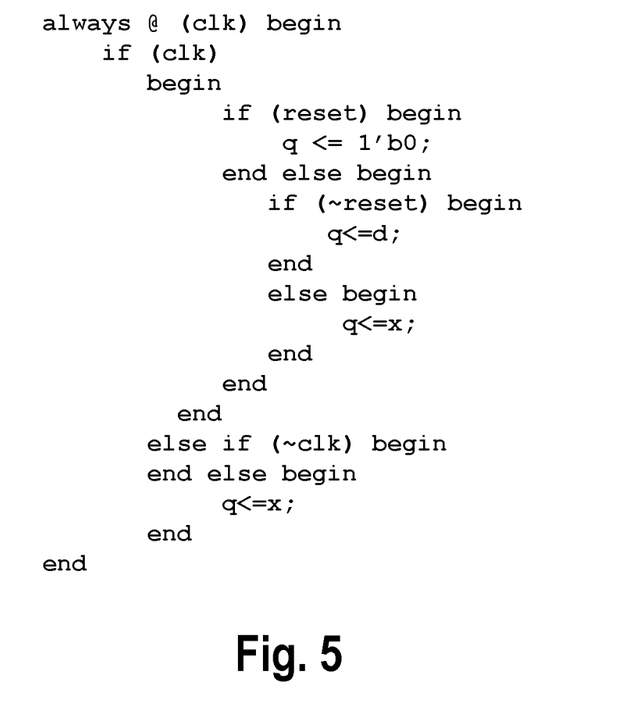
FIG. 5 illustrates modified RTL code for a flip-flop that propagates an X-state received on any of its inputs.

FIG. 5, illustrates the same flip-flop with x-uglification that causes q to be x if the d input is x, if reset is x, or if clk is x. For the flip-flop of FIG. 5, if clk is 1, the code first checks to see if reset is 1 and takes appropriate action, then checks to see if reset is 0, and takes appropriate action. If reset is neither 1 or 0, implying reset=x, q takes on the value x. If clock is 0, no action is taken. If clk is neither 0 or 1, implying clk is x, q is assigned to x. If d is x, q already takes on the value x. Given this modification, the flip-flop representation propagates the indeterminate state x found on any of its inputs.

Referring again to FIG. 1, the X-uglification can be seen to be necessary by looking at the counter 121. If the counter representation were not modified to propagate the clock signal CLK_DIV_OUT 109 through the RTL representation, then the RTL would quash the X received and the simulation results would be as seen in FIG. 2. Thus, use of the MIX technique to insert the X-state and X-uglification provides more robust metastable simulation earlier in the design cycle to assess the impact of metastable events caused by, e.g., clock glitches, improper reset usage, or CDC violations.

Figure 6:
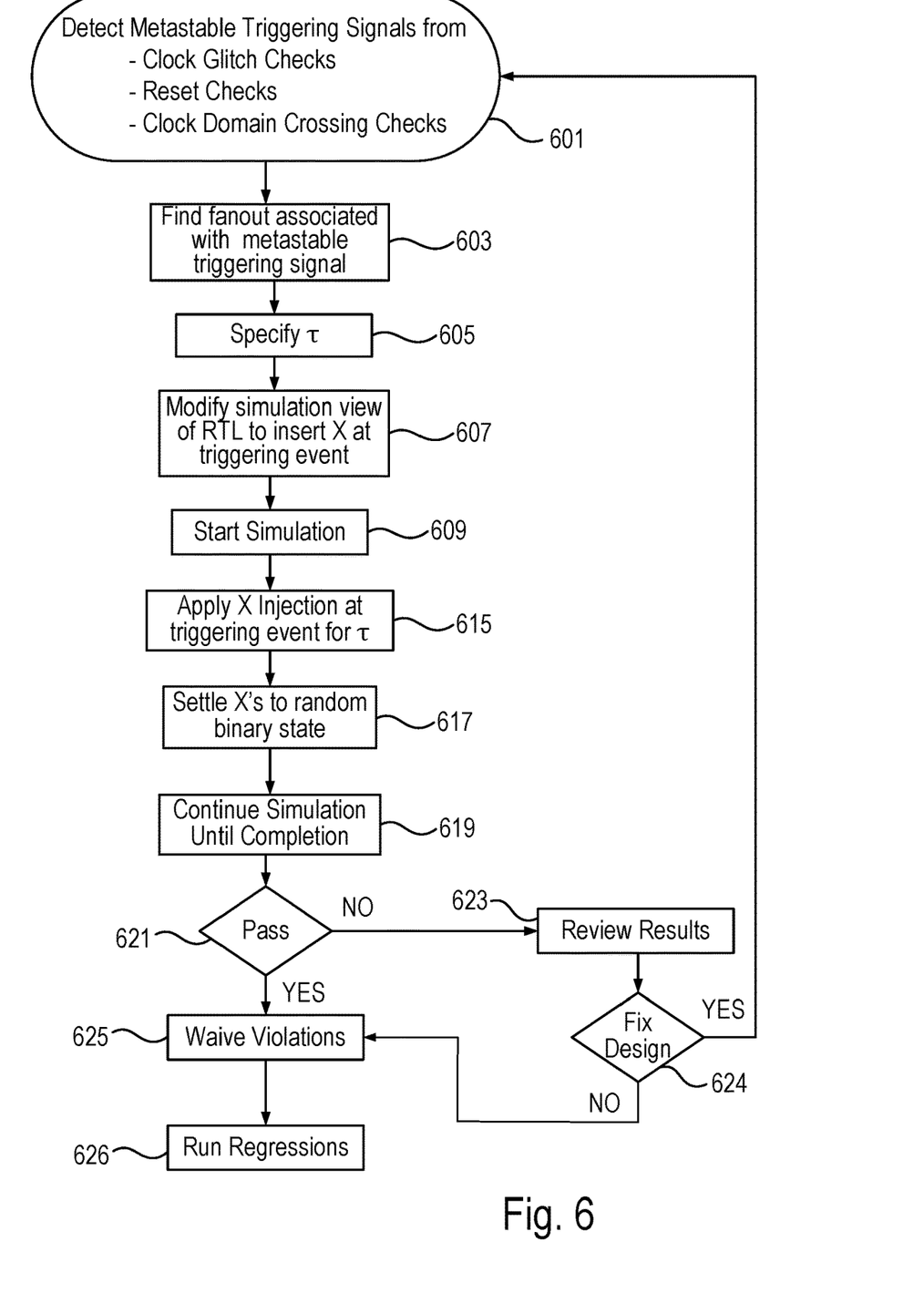
FIG. 6 illustrates a flow chart of the MIX technique used in a design environment.

FIG. 6 illustrates a flow diagram illustrating the use of the MIX technique. In 601, metastable event triggering signals are identified by clock domain crossing (CDC) checks, reset checks, clock glitch checks, or from another source. For example, in embodiments a clock domain crossing (CDC) check for unsynchronized signals crossing between clock domains identifies one or more metastable triggering event signals. When such a signal is identified, the MIX technique introduces the X-state into the output of circuits affected by the metastable event triggering signal. In addition, embodiments use simulation-based methodologies such as System Verilog Assertion (SVA) to detect clock glitches and unsynchronized reset signals potentially causing metastable events. In such cases, the circuits affected by those signals have their outputs set to the X-state during simulation for the duration τ. For example, a reset check may flag the reset signal supplied to flip-flops 101, 103, and/or 125. The MIX technique inserts the indeterminate state X into outputs of circuits that are fanouts of the reset signal at the assertion of the reset signal.

In other circumstances, rather than relying on various checks, a designer may want to use the MIX technique to check a specific portion of a design as a result of a design change. Thus, the signal that may result in the metastable event may be identified manually.

In 603, the fanouts of the metastable event triggering signal are determined by inspection or using such tools as Verdi from Synopsis. By way of example, with reference to FIG. 1, the fanout outputs of the metastable triggering event signal refers to outputs of flip-flops 103 and 105. Once the fanout is determined, the time τ is specified in 605. As explained above, embodiments use a single τ or separate τs for each fanout circuit. In 607 the simulation view of the RTL is modified to set the outputs of the circuits affected by the metastable event triggering signal to X for the time τ responsive to a metastable triggering event such as a clock glitch, a reset, or a signal changing state and crossing clock domains at a particular time. The simulation view of the RTL refers to the fact that the X-uglified code is used for simulation and will not be synthesized.

In 609, the simulation is started and in 615, responsive to the metastable triggering event, X is injected for the time duration τ. At the end of τ the outputs of the affected circuits are settled to a random state in 617 and the simulation continues until completed in 619. Prior to simulation, the RTL code has been modified to ensure that indeterminate inputs represented by the X-state are not quashed by the circuit representations, e.g., the code is X-uglified.

If the simulation shows the design did not pass in 621, the engineer reviews the results in 623, makes necessary design changes in 624, if desired, and returns to identify metastable event triggering signals in 601. If in 624, the engineer decides that a design fix is not required, the particular violation can be waived in 625 and regression testing run in 626. If the design passes the simulation testing, the engineer can waive the violations in 625.

Figure 7:
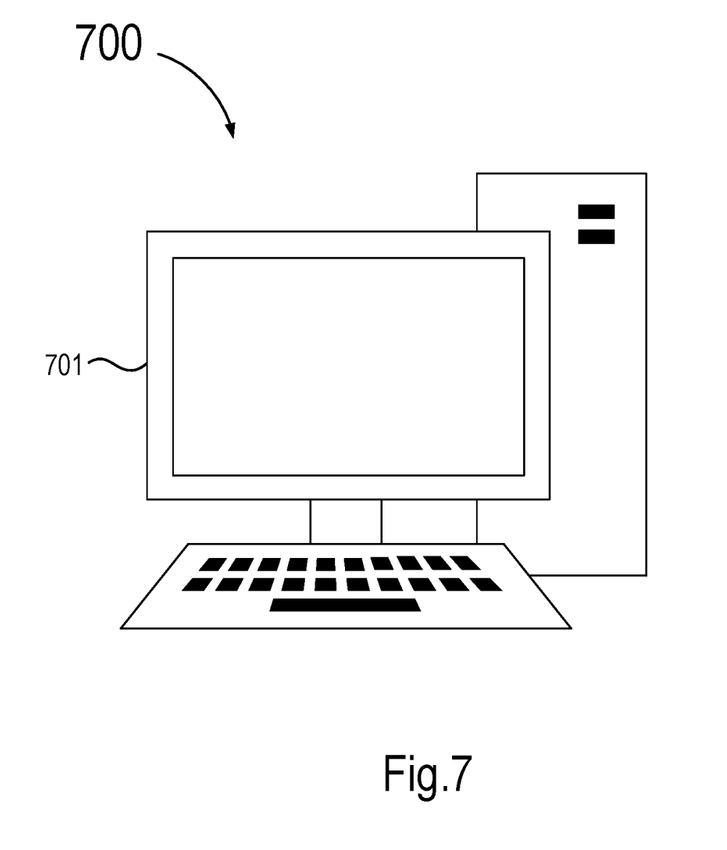
FIG. 7 illustrates a computer system which can be used to simulate designs using the MIX technique.

Embodiments execute the RTL code utilizing the MIX technique on a computer system such as computer system 700 shown in FIG. 7. The RTL code utilizing the MIX technique, along with the test patterns applied during simulations, are stored on computer-readable media of the computer system and executed by one or more processors of computer system 700. The computer-readable media include tangible non-transitory computer readable media, e.g., a disk, tape, or other magnetic, optical, or electronic storage medium electronic storage medium (e.g., random access memory, read-only-memory, non-volatile memory). In embodiments, the computer system includes one or more displays 701 to provide visual representations of the simulations such as shown in FIG. 3.

Thus, aspects of simulating metastable events have been described. The description set forth herein is illustrative, and is not intended to limit the scope of the following claims. Variations and modifications of the embodiments disclosed herein may be made based on the description set forth herein, without departing from the scope and spirit of the following claims.

What is claimed is:

1. A method of simulating a design on one or more processors comprising:
    setting an output signal of a software representation of a flip-flop to an indeterminate state responsive to the software representation of the flip-flop receiving a metastable triggering event during a register transfer language (RTL) simulation on the one or more processors, the software representation of the flip-flop setting the output signal to the indeterminate state responsive to any one of a clock signal being supplied to the software representation of the flip-flop being in the indeterminate state, a data input to the software representation of the flip-flop being in the indeterminate state, and to a reset signal being supplied to the software representation of the flip-flop being in the indeterminate state;
    maintaining the indeterminate state on the output signal of the software representation of the flip-flop for an amount of time; and
    responsive to expiration of the amount of time, setting the output signal to a first random binary value.

2. The method as recited in claim 1 wherein the amount of time is programmable.

3. The method as recited in claim 1 further comprising receiving the amount of time through a user interface.

4. The method as recited in claim 1 further comprising:
    setting a second output signal from a software representation of another circuit receiving the metastable triggering event to the indeterminate state for a second amount of time; and
    responsive to the second amount of time expiring, independent of the output signal being set to the first random binary value, setting the second output signal to a second random binary value that is identical or different than the first random binary value.

5. The method as recited in claim 1 wherein the metastable triggering event is a clock glitch.

6. The method as recited in claim 1 wherein the metastable triggering event is a reset signal changing state.

7. The method as recited in claim 1 wherein the metastable triggering event is a signal that crosses from a first clock domain to a second clock domain changing state.

8. The method as recited in claim 1 further comprising determining if after completion of simulation, the design recovers to a known state.

9. The method as recited in claim 1 further comprising propagating the indeterminate state through one or more circuit representations receiving the output signal on a reset input or a clock input of the one or more circuit representations while the output signal is at the indeterminate state.

10. A non-transitory computer readable storage medium storing instructions to simulate a design executable on one or more processors to cause the one or more processors to:
    set an output signal of a software representation of a flip-flop to an indeterminate state responsive to the software representation of the flip-flop receiving a metastable triggering event during a register transfer language (RTL) simulation on the one or more processors, the software representation of the flip-flop setting the output signal to the indeterminate state responsive to the metastable triggering event being indicated by any one of a clock signal being supplied to the software representation of the flip-flop being in the indeterminate state, a data input being supplied to the software representation of the flip-flop being in the indeterminate state, and to a reset signal being supplied to the software representation of the flip-flop being in the indeterminate state;

maintain the indeterminate state on the output signal of the software representation of the flip-flop for a specified amount of time; and responsive to expiration of the specified amount of time, set the output signal to a first random binary value.

11. The non-transitory computer readable storage medium of claim 10 further comprising instructions to receive a user specified value for the specified amount of time.

12. The non-transitory computer readable storage medium of claim 10 wherein the instructions further cause the one or more processors to:

set a second output signal from a software representation of a circuit receiving the metastable triggering event to the indeterminate state for a second amount of time; and responsive to expiration of the second amount of time, independent of the output signal being randomly set to the first random binary value, setting the second output signal to a second random binary value.

13. The non-transitory computer readable storage medium of claim 10 wherein the metastable triggering event is a clock glitch.

14. The non-transitory computer readable storage medium of claim 10 wherein the metastable triggering event is a reset signal changing state.

15. The non-transitory computer readable storage medium of claim 10 wherein the metastable triggering event is a signal that crosses from a first clock domain to a second clock domain changing state.

16. The non-transitory computer readable storage medium of claim 10 wherein the instructions further cause the one or more processors to propagate the indeterminate state through software representations of circuits that receive the output signal on a reset input or a clock input of the software representations while the output signal is set to the indeterminate state.

17. The non-transitory computer readable storage medium of claim 10 where the indeterminate state is represented by a value of X.

* * * * *